United States Patent
Jang

(10) Patent No.: US 7,505,358 B2
(45) Date of Patent: Mar. 17, 2009

(54) SYNCHRONOUS SEMICONDUCTOR MEMORY DEVICE

(75) Inventor: Ji-Eun Jang, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 243 days.

(21) Appl. No.: 11/478,087

(22) Filed: Jun. 30, 2006

(65) Prior Publication Data

US 2007/0070714 A1 Mar. 29, 2007

(30) Foreign Application Priority Data

Sep. 29, 2005 (KR) ............... 10-2005-0090952
Dec. 16, 2005 (KR) ............... 10-2005-0124355

(51) Int. Cl.
 *G11C 8/00* (2006.01)
(52) U.S. Cl. ............... 365/233.1; 365/233.12; 365/238.5; 365/203
(58) Field of Classification Search ............ 365/233.1, 365/233.12, 238.5, 203
See application file for complete search history.

(56) References Cited

U.S. PATENT DOCUMENTS

| | | | |
|---|---|---|---|
| 6,233,183 B1 | 5/2001 | Kim et al. | |
| 6,657,907 B2 | 12/2003 | Lee | |
| 6,826,115 B2* | 11/2004 | Lee et al. | ............ 365/238.5 |
| 7,177,228 B2* | 2/2007 | Kim et al. | ............ 365/233.1 |

FOREIGN PATENT DOCUMENTS

| | | |
|---|---|---|
| JP | 6-259996 | 9/1994 |
| JP | 11-162170 | 6/1999 |
| JP | 2000-100160 | 4/2000 |
| KR | 1999-0038915 | 6/1999 |
| KR | 10-0252043 B1 | 1/2000 |
| KR | 2003-0056002 | 7/2003 |
| KR | 2003-0060640 | 7/2003 |
| KR | 2003-0084510 | 11/2003 |
| KR | 10-2005-0033679 | 4/2005 |

OTHER PUBLICATIONS

Korean Patent Gazette issued in Korean Patent Application No. KR 10-2005-0124355, mailed Jan. 17, 2007.

* cited by examiner

*Primary Examiner*—Richard Elms
*Assistant Examiner*—Nam Nguyen
(74) *Attorney, Agent, or Firm*—McDermott Will & Emery LLP

(57) ABSTRACT

A synchronous semiconductor memory device can perform an internal operation for an input address with reliability regardless of the frequency of a system clock. The semiconductor memory device includes an internal operation detecting unit for generating a flag signal in response to internal command signals; a delay unit for delaying the flag signal for a programmed time; and an enable signal generating unit for generating an enable signal activated in response to a transition timing of the flag signal and inactivated in response to a transition timing of the delayed flag signal, wherein an internal address derived from an external address is transferred to a core area while the enable signal is activated.

34 Claims, 8 Drawing Sheets

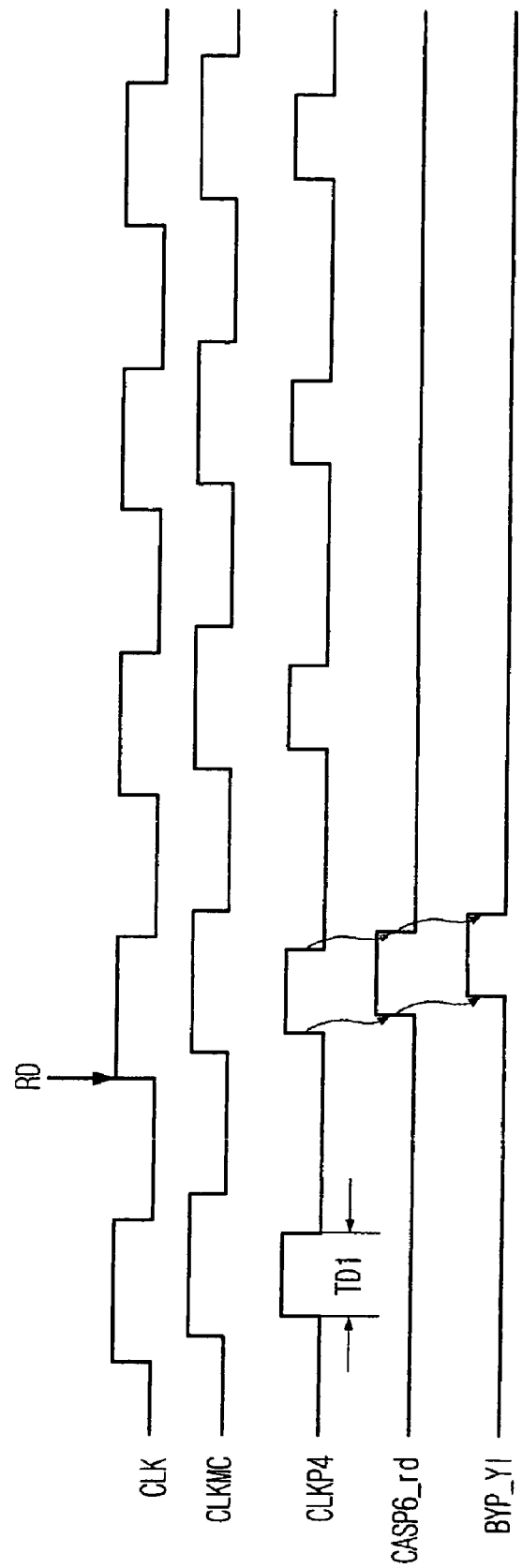

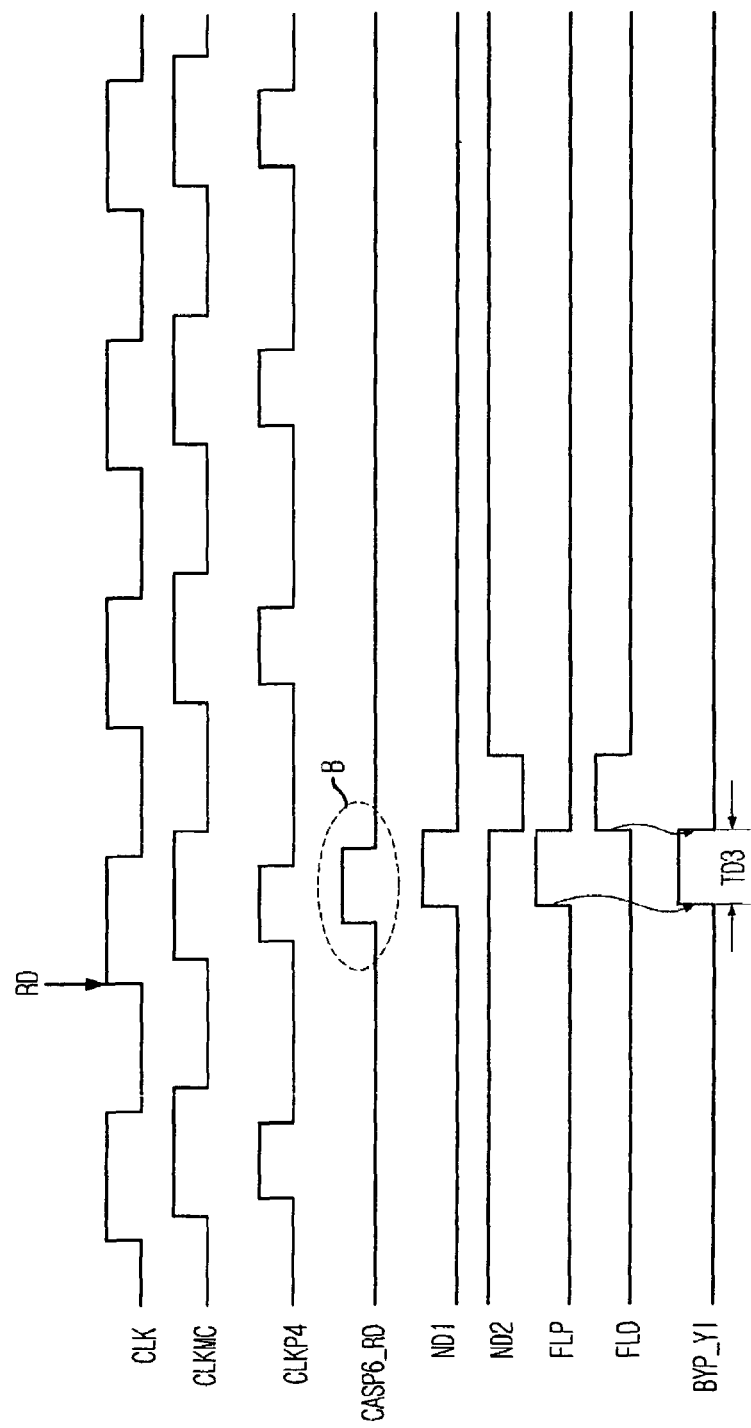

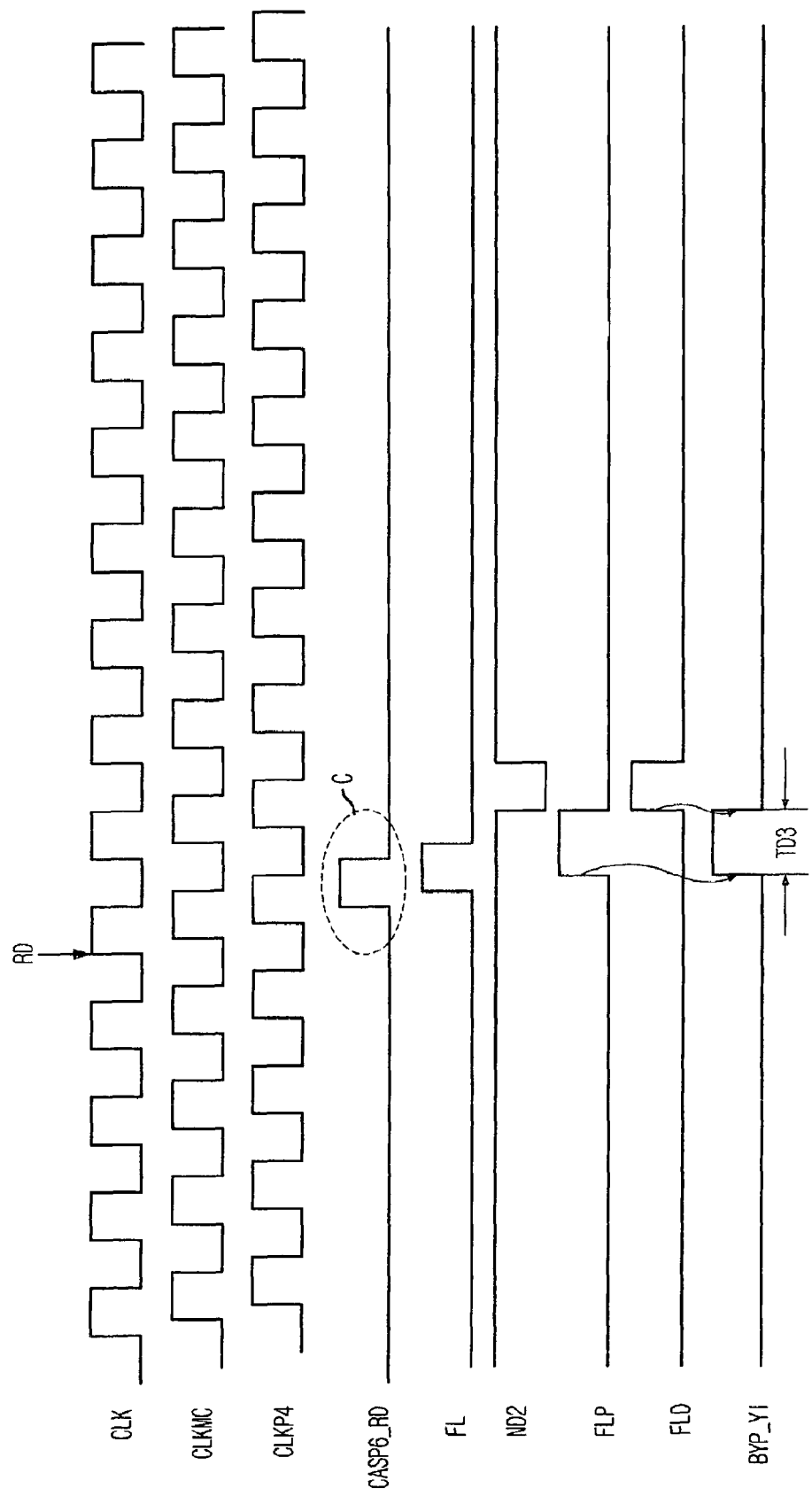

US 7,505,358 B2

SYNCHRONOUS SEMICONDUCTOR MEMORY DEVICE

FIELD OF THE INVENTION

The present invention relates to a semiconductor memory device and more particularly to a circuit for generating an internal command in a synchronous semiconductor memory device.

DESCRIPTION OF RELATED ARTS

A semiconductor memory device such as a dynamic random access memory device includes a cell array area and a peripheral area. The cell array area includes a plurality of cells for storing data. The peripheral area includes a logic circuit for outputting data externally from the cell array area or inputting external data into the cell array area.

The cell array area has a plurality of row lines, i.e., word lines and column lines, i.e., bit lines, wherein the row lines and the columns lines intersect each other and the cells of the cell array area are arranged at the intersected points.

Addresses are arranged at the row lines and the columns lines, respectively. That is, row addresses are arranged at the row lines and column addresses are arranged at the column lines.

The external row address and column addresses are input in response to a command, e.g., active command, read command, write command and precharge command.

Generally, when external data are to be input or data are to be output an active command and a row address are input into the semiconductor memory device together to set the semiconductor memory device to an active mode. In the active mode, the input row address is decoded and as a result, a word line of the cell array area is selected in response to the input active command.

After the active command is input to the semiconductor memory device, a read command or a write command with a column address is input into the semiconductor memory device. Then, the semiconductor memory device assumes a read or a write operation mode. In a read or a write operation mode, the input column address is decoded and as a result, a bit line of the cell array area is selected in response to the read command input or the write command input. For selecting one bit line, an internal column address generating unit of the semiconductor memory device generates an internal column address in response to the column address input and the the read command input or the write command input.

In a synchronous semiconductor memory device, the row address, the column address and commands such as the read command, the write command and the precharge command are input to the semiconductor memory device in response to a system clock.

FIG. 1 is a block diagram of circuits for receiving addresses and commands in a semiconductor memory device.

As shown in FIG. 1, the semiconductor memory device includes an address buffer 100 for receiving and buffering address A<0:N>, an address latch 102 for latching the buffered address by the address buffer 100 in response to an internal clock signal CIKP4, a column address counter 104 for counting the latched address to output a counted address, a column address decoder for decoding the counted address to output an internal column address YI<0:K> in response to a column address enable signal BYP_YI.

The semiconductor memory device also includes a clock buffer 200 for receiving and buffering a system clock CLK and /CLK to output the internal clock signal CIKP4, a command buffer 300 for receiving command signals /RAS, /CAS and /WE from external, a command latch 302 for latching the received command signals in response to the internal clock signal CIKP4, a command decoder 304 for decoding the latched command signals and a column address enable signal generator 306 for generating the column address enable signal BYP_YI with use of the decoded command signals by the command decoder 304.

FIG. 2 is a schematic diagram of a clock buffer in FIG. 1.

As shown in FIG. 2, the clock buffer includes a comparator 210 and a pulse generator 220.

The comparator 210 comprises a differential amplifier receiving the differential signals, i.e., the system clock CLK and /CLK.

The pulse generator 220 includes a delay DELAY for delaying an output signal CIKMC of the comparator 210, a first inverter for inverting the output signal CIKMC of the comparator 210, a NAND logic gate for receiving the output CIKMC and an output of inverter and a second inverter for inverting an output of the NAND logic gate to output the internal clock.

FIG. 3 is a schematic diagram of a conventional column address enable signal generator that may be employed in FIG. 1.

As shown, the conventional column address enable signal generator includes an inverter INV1 for inverting an internal read signal CASP6_RD, an inverter INV2 for inverting an internal write signal CASP6_WT, an inverter INV3 for inverting an column burst signal ICASP6 and an NAND logic gate NAND1 for performing a NAND logical operation of output signals of the inverters INV1, INV2 and INV3 to output the column address enable signal BYP_YI.

The internal read signal CASP6_RD, the internal write signal CASP6_WT and the column burst signal ICASP6 are control signals generated by the command decoder 304 in response to an input command related to column operation. The internal read signal CASP6_RD is generated in response to an external read command. The internal write signal CASP6_WT is generated in response to an external write command. The column burst signal ICASP6 has transitions corresponding to the number of predetermined burst length when the read command or the write command is input.

The conventional column address enable signal generator 306 generates the activated column address enable signal BYP_YI when at least one signal of the internal read signal CASP6_RD, the internal write signal CASP6_WT and the column burst signal ICASP6 becomes an enable state of logic high level.

FIG. 4A is a timing diagram for operation of the conventional column address enable signal generator of FIG. 3 at low frequency. FIG. 4B is a timing diagram for operation of the conventional column address enable signal generator of FIG. 3 at high frequency.

After an external command, i.e., the read command or the write command, is input, at first, the command buffer 300 receives and buffers the input command. The command latch 302 latches the buffered command in response to the internal clock signal CIKP4 and the command decoder 304 decodes the latched command to output at least one of the internal read signal CASP6_RD, the internal write signal CASP6_WT and the column burst signal ICASP6 to the column address enable signal generator 306.

The pulse width of the internal clock signal CLKP4 is determined by delay timing of the delay DELAY of the pulse generator 220. An input command is latched by the command latch 302 in response to the internal clock signal CIKP4. Therefore, the width of the control signals, e.g., the internal read signal CASP6_RD, the internal write signal CASP6_WT and the column burst signal ICASP6 are the same as the internal clock signal CLKP4.

As shown in FIG. 4a, when the frequency of the system clock CLK is low, the activated column address enable signal BYP_YI has a pulse width 'TD1', wherein the pulse width 'TD1' is the same width as the internal clock signal CLKP4. In this case, the width of the internal clock signal CLKP4 is determined by the delay time of the delay DELAY to the pulse generator 220.

Alternatively, as shown in FIG. 4b, when the frequency of the system CLK is high, the activated column address enable signal BYP_YI has a pulse width 'TD2', wherein the pulse width 'TD2' is the same width as the system clock CLK.

When the frequency of the system CLK is high, then the pulse width of the system CLK is shorter than that of the delay time of the delay DELAY to the pulse generator 220.

The width of the internal clock signal CLKP4 is determined by the system clock CLK. The width of the internal read signal CASP6_RD is determined by the width of the internal clock signal CLKP4. The activated column address enable signal BYP_YI is determined by the width of the internal read signal CASP6_RD. Therefore, the width of the activated column address enable signal BYP_YI is determined the width of the system clock CLK.

In conclusion, when the semiconductor performs an operation in response to high frequency of the system clock, a margin of the activated column address enable signal BYP_YI is not enough. As a result, the column address decoder 106 has not a sufficient margin for generating the internal column address YI<0:K>. A signal 'A' denoted in FIG. 4b is needed for accessing data without error. Then, an error can occur in an operation of accessing data.

SUMMARY OF THE INVENTION

It is, therefore, an object of the present invention to provide various embodiments for a synchronous semiconductor memory device that can perform an internal operation for an input address with reliability regardless the frequency of a system clock.

In accordance with an aspect of the present invention, there is provided a synchronous semiconductor memory device including: an internal operation detecting unit for generating a flag signal in response to internal command signals; a delay unit for delaying the flag signal for a programmed time; and an enable signal generating unit for generating an enable signal activated in response to a transition timing of the flag signal and inactivated in response to a transition timing of the delayed flag signal, wherein an internal address derived from an address input from the external is transferred into a core area while the enable signal is activated.

In accordance with an another aspect of the present invention, there is provided a synchronous semiconductor memory device including: an internal operation detecting unit for generating a flag signal in response to internal command signals; and an enable signal generating unit for generating an enable signal activated in response to a first transition timing of the flag signal and inactivated in response to a second transition timing of the flag signal, wherein an internal address derived from an external address input is transferred into a core area while the enable signal is activated.

In accordance with an another aspect of the present invention, a flag signal is generated in response to internal command signals; the flag signal is delayed for a programmed time; and an enable signal is activated in response to a transition timing of the flag signal and inactivated in response to a transition timing of the delayed flag signal; and an internal address derived from an external address input is transferred to a core area while the enable signal is activated.

BRIEF DESCRIPTION OF THE DRAWINGS

The above and other objects and features of the present invention will become apparent from the following description of preferred embodiments taken in conjunction with the accompanying drawings, in which:

FIG. 4A is a timing diagram of an operation of a conventional column address enable signal generator in FIG. 3 at a low frequency;

FIG. 6A is a timing diagram of an operation of the column address enable signal generator in FIG. 5 at low frequency; and FIG. 6B is a timing diagram of an operation of column address enable signal generator in FIG. 5 at a high frequency.

DETAILED DESCRIPTION OF THE INVENTION

Hereinafter, a semiconductor memory device in accordance with specific embodiments of the present invention will be described in detail referring to the accompanying drawings.

Figure 1:
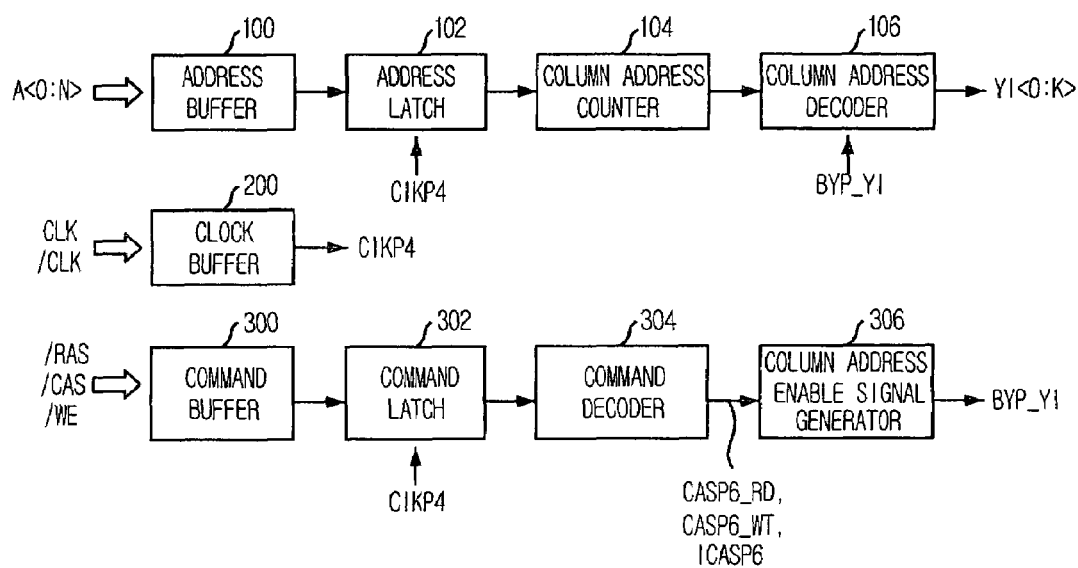
FIG. 1 is a block diagram of circuits for receiving addresses and commands in a semiconductor memory device.
Figure 2:
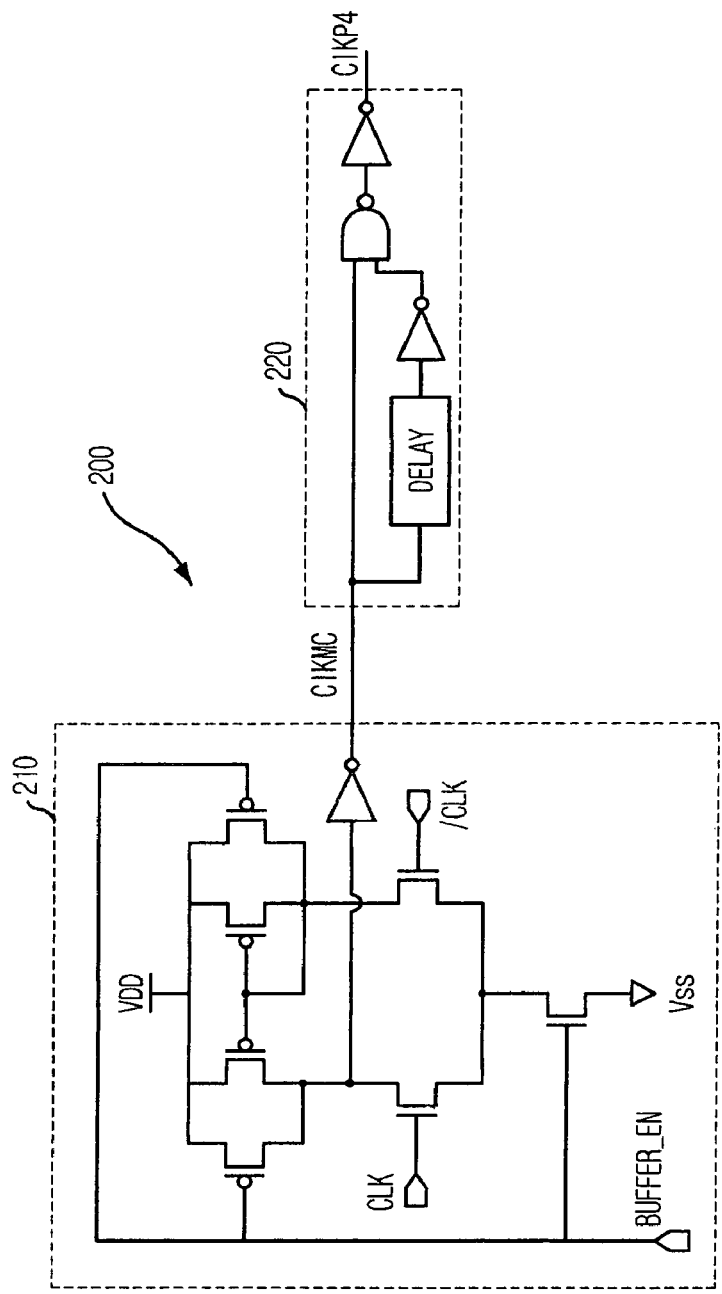
FIG. 2 is a schematic diagram of a clock buffer in FIG. 1.
Figure 3:
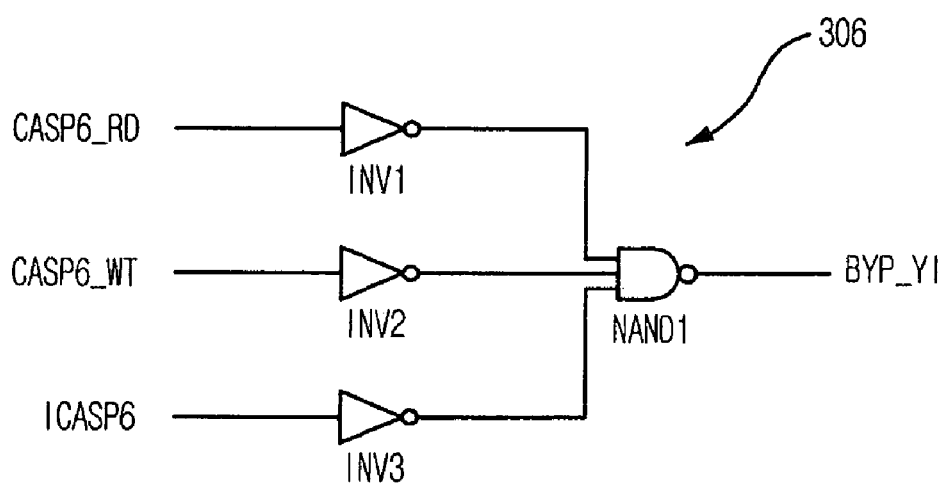
FIG. 3 is a schematic diagram of a conventional column address enable signal generator usable in FIG. 1.
Figure 4B:
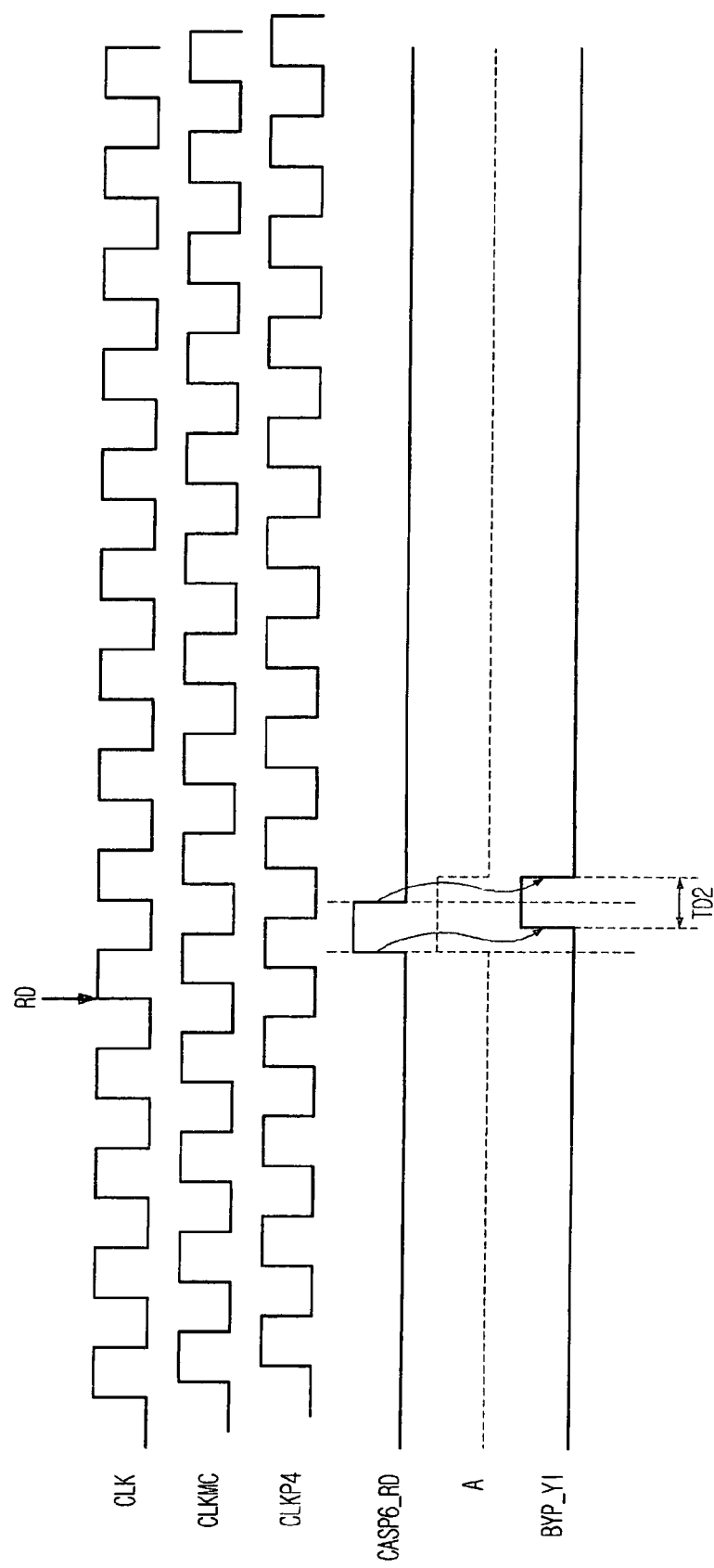
FIG. 4B is a timing diagram of an operation of the conventional column address enable signal generator in FIG. 3 at a high frequency.
Figure 5:
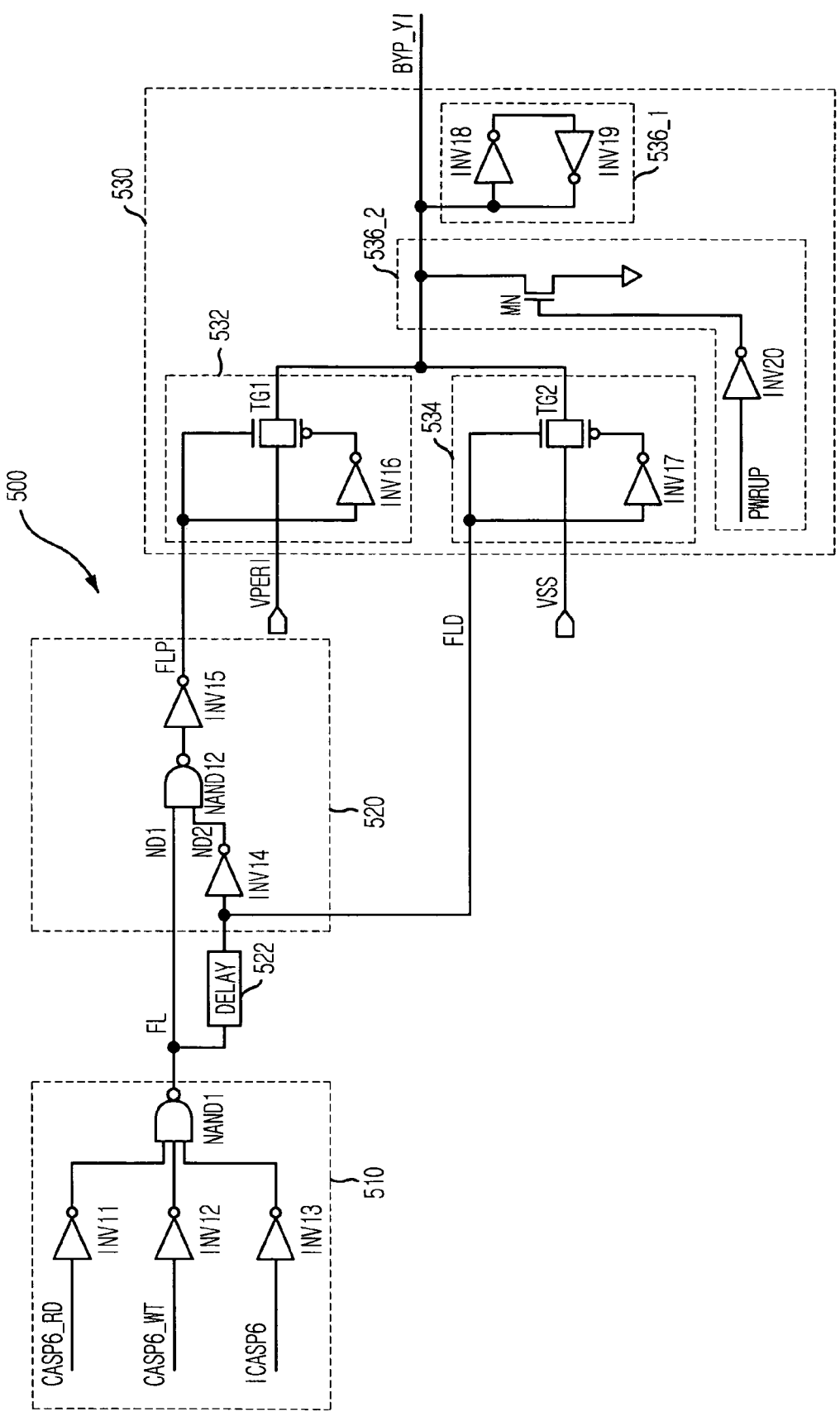
FIG. 5 is a schematic diagram showing a column address enable signal generator of a semiconductor memory device in accordance with an embodiment of the present invention.

FIG. 5 is a schematic diagram of a column address enable signal generator of a semiconductor memory device in accordance with an embodiment of the present invention.

As shown in FIG. 5, the semiconductor memory device includes an internal operation detecting unit 510 for generating a flag signal FL in response to internal command signals, a delay unit 522 for delaying the flag signal FL for the programmed time, a pulse generator 500 for generating a pulse flag signal FLP with use of the flag signal FL and the delayed flag signal FLD and an enable signal generating unit 530 for generating an enable signal BYP_YI activated in response to a transition timing of the pulse flag signal FLP and inactivated in response to a transition timing of the delayed flag signal FLD.

After an address is input into the semiconductor memory device, the input address is decoded and transformed into an internal address. The transformed address is transferred into a core area while the enable signal is activated. The core area is an area arranged in a plurality of memory cells.

Herein, the input address is a column address. Also, the internal command signals respectively corresponded to a plurality of signals for internal column operations, i.e., an internal read command signal for read operation CASP6_RD, an internal write command signal for writing operation CASP6_WT and an internal burst signal ICASP6. The internal burst command signal is for controlling burst length of output data. The internal operation detecting unit 510 generates the flag signal FL in response to at least one of the internal command signals.

The internal operation detecting unit 510 includes a first inverter INV11 for inverting the internal read command signal CASP6_RD, a second inverter INV12 for inverting the internal write command signal CASP6_WT, a third inverter INV13 for inverting the internal burst command signal ICASP6 and a first NAND logic gate NAND11 for performing a nand logical operation of outputs of the first to the third inverters.

The pulse generator includes a fourth inverter INV14 for inverting the delayed flag signal FLD, a second NAND logic gate NAND12 for performing a nand logical operation of the flag signal FL and an output of the fourth inverter INV14 and a fifth inverter INV15 for inverting an output of the second NAND logic gate NAND12.

The enable signal generating unit includes an activated transition detecting unit 532 for activating the enable signal BYP_YI in response to a transition timing of the pulse flag signal FL and transferring the activating enable signal BYP_YI to an output terminal EX and an inactivated transition detecting unit 534 for inactivating the enable signal BYP_YI in response to a transition timing of the delayed flag signal FLD and transferring the activating enable signal BYP_YI to the output terminal EX.

The activated transition detecting unit 532 includes a first transmission gate TG1 wherein the first transmission gate TG1 is turned on in response to a logic high level of the pulse flag signal FLP and transfers the logic high level signal VPERI into the output terminal EX as the activated enable signal. The logic high level signal VPERI transferred by the first transmission gate TG1 corresponds to a level of a peripheral driving voltage supplied as a logic high level into peripheral circuits of the semiconductor memory device.

The inactivated transition detecting unit 534 includes a second transmission gate TG2 wherein the second transmission gate TG2 is turned on in response to a logic high level of the delayed flag signal FLD and transfers the logic low level signal VSS to the output terminal EX as the inactivated enable signal. The logic low level signal VSS transferred by the second transmission gate TG2 corresponds to ground voltage level.

Also, the semiconductor memory device further includes a latch unit 536 for latching the enable signal BYP_YI wherein the latch unit 536 is connected to the output terminal EX. The latch unit includes a latch 536_1 for latching a signal supplied at the output terminal EX and an initialization unit 536_2 for initializing the latch into a predetermined signal. The predetermined signal is determined by a power up signal PWRUP.

FIG. 6A is a timing diagram showing operation of column address enable signal generator in FIG. 5 at low frequency. FIG. 6b is a timing diagram showing operation of column address enable signal generator in FIG. 5 at high frequency.

Hereinafter, the operation of the semiconductor memory device is described in detail referring to the FIGS. 5, 6a and 6b.

After a read command is input into the semiconductor memory device, a command latch latches the read command input in response to an internal clock signal. The internal clock signal is output from a clock buffer.

A command decoder decodes the latched read command and generates the internal read command as a pulse signal having the logic high level to the internal operation detecting unit 510. The internal operation detecting unit 510 generates the flag signal FL as a pulse signal having the logic high level.

The delay unit 522 delays the flag signal for the programmed time to output the delayed flag signal. Herein, the programmed time is denoted as 'TD3' in FIGS. 6A and 6B.

The pulse generator 500 generates the pulse flag signal FLP from the flag signal FL and the delayed flag signal FLD.

The activated transition detecting unit 532 activates the enable signal BYP_YI to pull up the output terminal EX into the logic high level, i.e., the level of the peripheral driving voltage VPERI, in response to the transition time of the pulse flag signal FLP. The inactivated transition detecting unit 534 inactivates the enable signal BYP_YI by pulling down the output terminal EX to the logic low level, i.e., the level of the ground voltage VSS, in response to the transition time of the delayed flag signal FLD.

Therefore, the period that the enable signal BYP_YI is activated is determined by an interval between the transition time of the pulse flag signal FLP and the transition time of the delayed flag signal FLD. That is, regardless of a pulse width of the internal read command signal CASP6_RD, the width of the enable signal BYP_YI is fixed as the period 'TD3'.

As described above, after address is input into the semiconductor memory device, the input address is decoded and transformed into an internal address. The transformed address is transferred into the core area while the enable signal BYP_YI is activated.

Whether the frequency of the system clock is high or low, the pulse width of the internal read command signal CASP6_RD changes like as the 'B' and 'C' respectively denoted in FIGS. 6A and 6B. However, regardless of the frequency of the system clock, the semiconductor memory device by the present invention can generate the enable signal BYP_YI having a fixed activating period, i.e., 'TD3'. Therefore, the internal address is transferred into the core area with reliability. As a result, data access is performed with reliability.

In particular, in high frequency of the system clock, efficient data access can be performed by the semiconductor memory device in the present invention.

As an alternative, the the present invention can delete the delay 522. In this case, the activated transition detecting unit 530 activates the enable signal BYP_YI in response to a first transition timing of the pulse flag signal FLP and transfers the activated enable signal BYP_YI to the output terminal EX. The inactivated transition detecting unit 534 inactivates the enable signal BYP_YI in response to a second transition timing of the pulse flag signal FLP and transfers the inactivated enable signal BYP_YI to the output terminal EX.

The inventive concepts described above are applicable to various alternatives, modifications and equivalents of the disclosed semiconductor memory. For example, those skilled in the art would appreciate that the scheme described in FIG. 5 can employ other types of logical circuits.

The present application contains subject matter related to Korean patent application No. 2005-90952 and 2005-124355 filed in the Korea Patent Office on Sep. 29, 2005 and Dec. 16, 2005, respectively, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claim is:

1. A semiconductor memory device, comprising:
    an internal operation detecting unit for generating a flag signal in response to internal command signals;
    a delay unit for delaying the flag signal for a programmed time;
    a pulse generator for generating a pulse flag signal based on the flag signal and the delayed flag signal; and
    an enable signal generating unit for generating an enable signal activated in response to a transition timing of the pulse flag signal and inactivated in response to a transition timing of the delayed flag signal, wherein an internal address derived from an external address input is transferred to a core area while the enable signal is activated.

2. The semiconductor memory device of claim 1, wherein the internal command signals respectively correspond to a plurality of internal column operations.

3. The semiconductor memory device of claim 2, wherein the internal operation detecting unit generates the flag signal in response to one or more of the internal command signals.

4. The semiconductor memory device of claim 3, wherein each of the internal command signals is selected from a group comprising an internal read command signal for a read operation, an internal write command signal for a writing operation and an internal burst command signal for controlling burst length of output data.

5. The semiconductor memory device of claim 4, wherein the internal operation detecting unit includes:
- a first inverter for inverting the internal read command signal;
- a second inverter for inverting the internal write command signal;
- a third inverter for inverting the internal burst command signal; and
- a first logic gate for performing a NAND operation of outputs of the first to third inverters.

6. The semiconductor memory device of claim 1, wherein the external address is a column address.

7. The semiconductor memory device of claim 1, wherein the pulse generator includes:
- a fourth inverter for inverting the delayed flag signal;
- a second NAND logic gate for performing a NAND operation of the flag signal and an output of the fourth inverter; and
- a fifth inverter for inverting an output of the second NAND logic gate to output the pulse flag signal.

8. The semiconductor memory device of claim 7, wherein the enable signal generating unit includes:
- an activated transition detecting unit for producing the enable signal activated in response to a transition timing of the pulse flag signal and transferring the activated enable signal to an output terminal; and
- an inactivated transition detecting unit for producing the enable signal inactivated in response to a transition timing of the delayed flag signal and transferring the inactivated enable signal to the output terminal.

9. The semiconductor memory device of claim 8, wherein the activated transition detecting unit includes a first transmission gate that is turned on in response to a logic high level of the pulse flag signal and transfers a signal having the logic high level to the output terminal as the activated enable signal.

10. The semiconductor memory device of claim 9, wherein the logic high level signal transferred by the first transmission gate corresponds to a peripheral driving voltage supplied to peripheral circuits of the semiconductor memory device.

11. The semiconductor memory device of claim 10, wherein the inactivated transition detecting unit includes a second transmission gate that is turned on in response to a logic high level of the delayed flag signal and transfers a signal having the logic low level to the output terminal as the inactivated enable signal.

12. The semiconductor memory device of claim 11, wherein the logic low level signal transferred by the second transmission gate corresponds a ground voltage.

13. The semiconductor memory device of claim 12, further comprising a latch unit connected to the output terminal for latching the enable signal.

14. The semiconductor memory device of claim 13, wherein the latch unit includes:
- a latch for latching the enable signal supplied at the output terminal; and
- an initialization unit for initializing the latch with a predetermined signal.

15. A semiconductor memory device, comprising:
- an internal operation detecting unit for generating a flag signal in response to internal command signals;
- a pulse generator for generating a pulse flag signal with use of the flag signal; and
- an enable signal generating unit for generating an enable signal activated in response to a first transition timing of the pulse flag signal and inactivated in response to a second transition timing of the pulse flag signal, wherein an internal address derived from an external address input is transferred to a core area while the enable signal is activated.

16. The semiconductor memory device of claim 15, wherein the internal command signals respectively correspond to a plurality of internal column operations.

17. The semiconductor memory device of claim 16, wherein the external address is a column address.

18. The semiconductor memory device of claim 15, wherein the internal operation detecting unit generates the flag signal in response to one or more of the internal command signals.

19. The semiconductor memory device of claim 18, wherein each of the internal command signals is selected from a group comprising an internal read command signal for a read operation, an internal write command signal for a writing operation and an internal burst command signal for controlling burst length of output data.

20. The semiconductor memory device of claim 19, wherein the internal operation detecting unit includes:
- a first inverter for inverting the internal read command signal;
- a second inverter for inverting the internal write command signal;
- a third inverter for inverting the internal burst command signal; and
- a first logic gate for performing a NAND operation of outputs of the first to third inverters.

21. The semiconductor memory device of claim 15, wherein the pulse generator includes:
- a fourth inverter for inverting the flag signal;
- a second logic gate for performing a NAND operation of the flag signal and an output of the fourth inverter; and
- a fifth inverter for inverting an output of the second logic gate to output the pulse flag signal.

22. The semiconductor memory device of claim 21, wherein the enable signal generating unit includes:
- an activated transition detecting unit for producing the enable signal activated in response to a first transition timing of the pulse flag signal and transferring the activated enable signal into an output terminal; and
- an inactivated transition detecting unit for producing the enable signal inactivated in response to a second transition timing of the pulse flag signal and transferring the inactivated enable signal to the output terminal.

23. The semiconductor memory device of claim 22, wherein the activated transition detecting unit includes a first transmission gate that is turned on in response to a logic high level of the pulse flag signal and transfers a signal having the logic high level to the output terminal as the activated enable signal.

24. The semiconductor memory device of claim 23, wherein the logic high level signal transferred by the first transmission gate corresponds to a peripheral driving voltage supplied to peripheral circuits of the semiconductor memory device.

25. The semiconductor memory device of claim 24, wherein the inactivated transition detecting unit includes a second transmission gate that is aimed on in response to a logic high level of the delayed flag signal and transfers a logic low level signal to the output terminal as the inactivated enable signal.

26. The semiconductor memory device of claim 25, wherein the logic low level signal transferred by the second transmission gate corresponds to a level of a ground voltage.

27. The semiconductor memory device of claim 26, further comprising a latch unit connected to the output terminal for latching the enable signal.

28. The semiconductor memory device of claim 27, wherein the latch unit includes:
   a latch for latching the enable signal supplied at the output terminal; and
   an initialization unit for initializing the latch with a predetermined signal.

29. A method for operating a semiconductor memory device, comprising:
   generating a flag signal in response to internal command signals;
   delaying the flag signal for a programmed time; and generating an enable signal activated in response to a transition timing of the flag signal and inactivated in response to a transition timing of the delayed flag signal; and
   transferring an internal address derived from an external address input into a core area while the enable signal is activated.

30. The method of claim 29, wherein the internal command signals respectively correspond to a plurality of internal column operations.

31. The method of claim 30, wherein transferring the internal address includes:
   decoding the input address;
   transforming the decoded address into the internal address; and
   transferring the internal address into the core area while the enable signal is activated.

32. The method of claim 31, wherein generating the flag signal includes:
   generating an internal read command signal for a read operation;
   generating an internal write command signal for a writing operation;
   generating an internal burst command signal for controlling burst length of output data; and
   generating the flag signal in response to the internal read command signal, the internal write command signal and the internal burst command signal.

33. The method of claim 32, wherein a voltage level of the activated enable signal corresponds to that of a peripheral driving voltage supplied into peripheral circuits of the semiconductor memory device.

34. The method of claim 33, wherein a voltage level of the inactivated enable signal corresponds to that of a ground voltage.

* * * * *